US008773203B2

(12) United States Patent
Baumgartner et al.

(10) Patent No.: US 8,773,203 B2
(45) Date of Patent: Jul. 8, 2014

(54) BROADBAND, HIGH-LINEARITY LED AMPLIFIER HAVING HIGH OUTPUT CAPACITY IN A COMPACT DESIGN

(75) Inventors: Robert Baumgartner, Puchheim/Bhf. (DE); Andreas Kornbichler, Dietramszell (DE); Joachim Walewski, Unterhaching (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/512,576

(22) PCT Filed: Oct. 19, 2010

(86) PCT No.: PCT/EP2010/065731
§ 371 (c)(1), (2), (4) Date: May 29, 2012

(87) PCT Pub. No.: WO2011/064052
PCT Pub. Date: Jun. 3, 2011

(65) Prior Publication Data

US 2012/0235747 A1 Sep. 20, 2012

(30) Foreign Application Priority Data

Nov. 26, 2009 (DE) ......................... 10 2009 055 891

(51) Int. Cl.
*H03F 3/18* (2006.01)

(52) U.S. Cl.
USPC ........................................... 330/263; 330/267

(58) Field of Classification Search
USPC .................. 330/263, 266, 267, 272, 273, 308
See application file for complete search history.

(56) References Cited

U.S. PATENT DOCUMENTS

| | | | | |
|---|---|---|---|---|
| 5,323,122 | A * | 6/1994 | Bowers | 330/263 |
| 5,963,065 | A * | 10/1999 | Alini et al. | 327/112 |
| 6,160,451 | A * | 12/2000 | Floru | 330/263 |
| 6,501,334 | B1 * | 12/2002 | Corsi et al. | 330/267 |
| 6,535,063 | B1 * | 3/2003 | Gibson et al. | 330/263 |
| 6,826,059 | B2 | 11/2004 | Böckle et al. | 363/17 |
| 6,882,225 | B2 * | 4/2005 | Deletraz | 330/263 |

(Continued)

FOREIGN PATENT DOCUMENTS

| | | | | |
|---|---|---|---|---|
| DE | 10013207 A1 | 9/2001 | | H05B 37/02 |
| JP | 62176225 A | 8/1987 | | H01L 33/12 |

(Continued)

OTHER PUBLICATIONS

Tietze, U., Halbleiter-Schaltungstechnik, Springer Verlag, 9th Edition. Auflage, Kapitel 17.2 Komplementare Emitterfolger, pp. 512-519, with English abstract, 1989.
Korean Office Action, Application No. 1020127016545, 7 pages.

*Primary Examiner* — Henry Choe
(74) *Attorney, Agent, or Firm* — King & Spalding L.L.P.

(57) ABSTRACT

An amplifier circuit for actuating a light diode is provided. The amplifier circuit may have a small output impedance of approximately 3 Ohms, a large bandwidth having a lower threshold frequency of 200 kHz and an upper threshold frequency of 5 MHz, for example, and an amplitude of the output current of several 100 mA, for example. The amplifier circuit may have an entry stage for actuating a driver circuit that actuates the light diode by means of a direct current supply.

13 Claims, 1 Drawing Sheet

(56) References Cited

U.S. PATENT DOCUMENTS

| | | | | |
|---|---|---|---|---|
| 7,463,223 | B2 | 12/2008 | Kimura | 345/76 |
| 7,532,823 | B2 | 5/2009 | Shimizu | 398/182 |
| 2003/0043611 | A1 | 3/2003 | Bockle et al. | 363/131 |
| 2005/0168419 | A1 | 8/2005 | Shimizu | 345/82 |
| 2012/0235747 | A1 | 9/2012 | Baumgartner et al. | 330/277 |

FOREIGN PATENT DOCUMENTS

| | | | | |
|---|---|---|---|---|
| JP | 2005223103 | A | 8/2005 | G09G 3/32 |
| KR | 20060010791 | A | 2/2006 | |
| WO | 01/33914 | A1 | 5/2001 | H05B 37/02 |
| WO | 01/69978 | A1 | 9/2001 | H05B 33/08 |
| WO | 2004/110109 | A1 | 12/2004 | H05B 41/392 |
| WO | 2011/064052 | A1 | 6/2011 | H05B 33/08 |

* cited by examiner

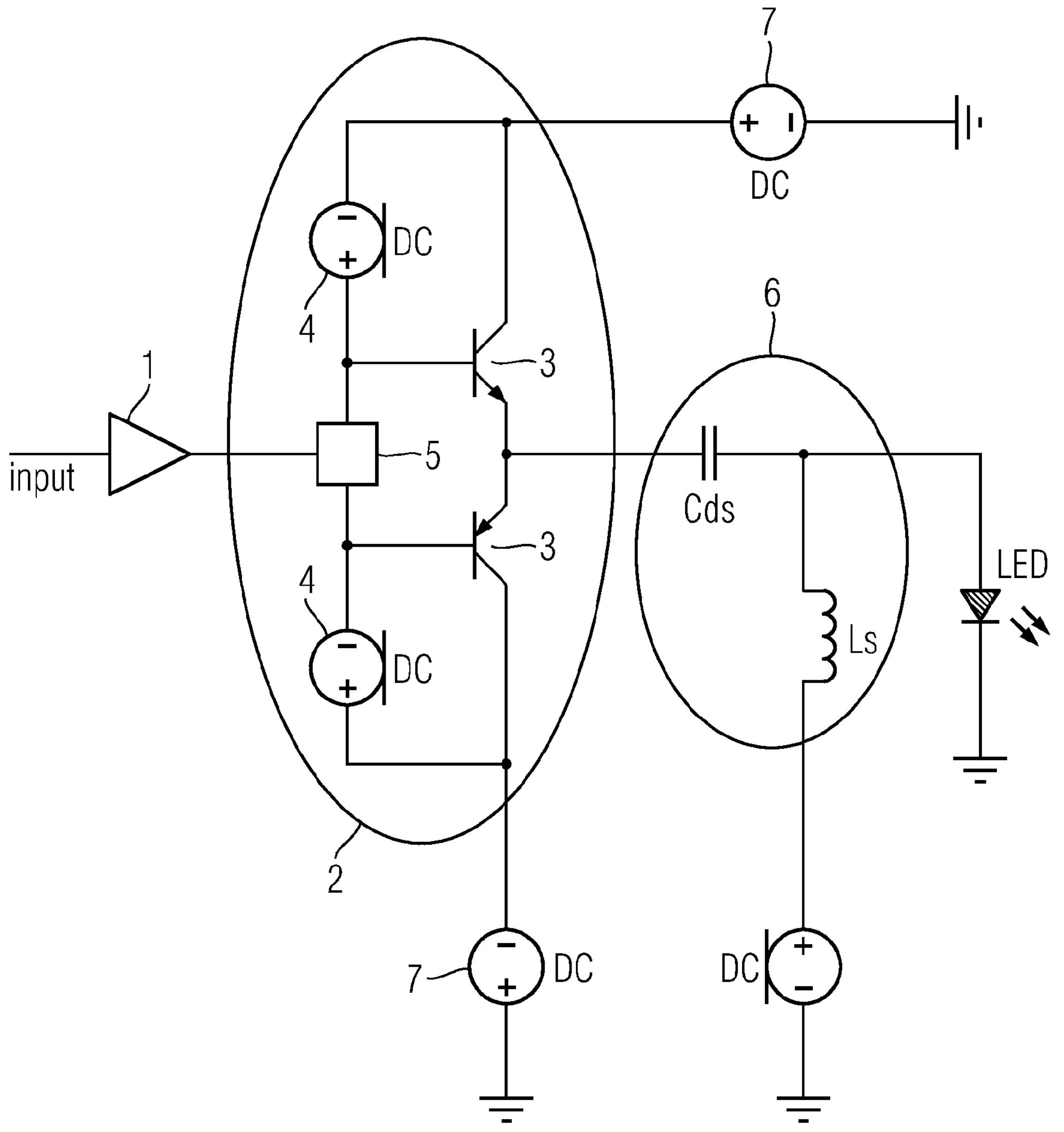
7
DC
DC
4
6
1
3
input
5
Cds
3
LED
4
DC
Ls
2
7
DC
DC

BROADBAND, HIGH-LINEARITY LED AMPLIFIER HAVING HIGH OUTPUT CAPACITY IN A COMPACT DESIGN

CROSS-REFERENCE TO RELATED APPLICATIONS

This application is a U.S. National Stage Application of International Application No. PCT/EP2010/065731 filed Oct. 19, 2010, which designates the United States of America, and claims priority to DE Patent Application No. 10 2009 055 891.8 filed Nov. 26, 2009. The contents of which are hereby incorporated by reference in their entirety.

TECHNICAL FIELD

The present disclosure relates to an amplifier circuit for actuating a light diode.

BACKGROUND

Room lighting may be used by modulation for transferring high data rates. In laboratory experiments, powerful light diode (LED) lighting systems such as an Osram OSTAR E3B LED module have proved to be suitable.

A powerful amplifier had to be developed for the OSTAR E3B LED module, which despite the low input impedance of the LED module meets the extremely high demands in respect of output power, bandwidth and linearity. Additionally, a compact design likewise plays an important role in enabling the LED module including the amplifier to be integrated into the room lighting.

The impedance of a light diode is very small across the entire frequency range from a few hundred kHz to several tens of MHz.

If conventional high-frequency amplifiers with an output impedance of 50 ohms are used to actuate the LED, their output impedance must be adjusted across the entire frequency range to the very small input impedance of the LED using impedance transformers. Such impedance transformers in the form of transformers are expensive, narrow-band and large. Operational amplifiers which can be obtained especially for the double-digit MHz range have a relatively low output impedance of approximately 5 ohms, and the frequency range and linearity are not large enough for this.

SUMMARY

In one embodiment, an amplifier circuit for actuating a light diode includes an entry stage for actuating a driver circuit, which actuates the light diode by means of a DC current supply, wherein the driver circuit has a first and a second transistor which are complementary to one another, their emitters being electrically connected to one another, a first current source being electrically connected between a base and a collector of the first transistor and a second current source being electrically connected between a base and a collector of the second transistor, and a voltage control circuit being electrically connected between both the bases of the transistors.

In a further embodiment, the voltage control circuit sets an electrical voltage between both the base terminals of the transistors as a function of temperatures of the transistors, such that the collector currents of the first and second transistor are kept constant. In a further embodiment, the DC current supply has a coupling capacitor electrically connected to the emitters of both the transistors with a first electrical terminal, the second electrical terminal of said coupling capacitor being electrically connected to ground via an electric coil and a third current source, the light diode being electrically connected in the conductance direction electrically parallel to the coil and to the third current source providing a closed-circuit current for the light diode. In a further embodiment, the entry stage is an amplifier amplifying the voltage of an input signal, in particular an operational amplifier, which is used to adjust the impedance, and the output of which is electrically connected to the voltage control circuit. In a further embodiment, the entry stage is an amplifier created as an integrated circuit, said amplifier having a larger bandwidth than the driver circuit. In a further embodiment, a first voltage source is electrically connected between the collector of the first transistor and ground and a second voltage source is electrically connected between the collector of the second transistor and ground, in each case to provide a supply voltage. In a further embodiment, the first transistor is an npn transistor and a positive pole of the first current source is electrically connected to the base of the first transistor. In a further embodiment, the second transistor is a pnp transistor and a negative pole of the second current source is electrically connected to the base of the second transistor. In a further embodiment, a negative pole of the third current source is electrically connected to ground. In a further embodiment, a negative pole of the first voltage source is electrically connected to ground and a positive pole of the first voltage source is electrically connected to the collector of the first transistor. In a further embodiment, a positive pole of the second voltage source is electrically connected to ground and a negative pole of the second voltage source is electrically connected to the collector of the second transistor. In a further embodiment, both the transistors are complementary field effect transistors, sources being the emitters, gates the bases and drains the collectors.

BRIEF DESCRIPTION OF THE DRAWINGS

Example embodiments will be explained in more detail below with reference to figures, in which:

FIG. 1 shows an example amplifier circuit, according to one embodiment.

DETAILED DESCRIPTION

Some embodiments provide an amplifier circuit for actuating a light diode such that the amplifier circuit has a small output impedance of approximately 3 ohms, a large bandwidth with a lower threshold frequency of 200 kHz and an upper threshold frequency of 50 MHz and an amplitude of the output current of several hundred mA. Furthermore, a compact design of amplifier circuit and light diode is to be created. An input impedance of the amplifier circuit may be adapted to digital circuits.

According to some embodiments an amplifier circuit is provided for actuating a light diode, the amplifier circuit having an entry stage for actuating a driver circuit which actuates the light diode using a DC power supply. The driver circuit has a first and a second transistor which are complementary to one another, their emitters being electrically connected to one another, a first current source being electrically connected between a base and a collector of the first transistor and a second current source being electrically connected between a base and a collector of the second transistor, and a voltage control circuit being electrically connected between the two bases of the transistors.

In one embodiment, to actuate the LED the amplifier circuit may have the following attributes:

1. The amplifier has a small output impedance. The output impedance needed for the present OSTAR light diode is approximately 3 ohms.
2. The amplifier has a large bandwidth. A lower threshold frequency of 200 kHz and an upper threshold frequency of 50 MHz is needed for the actuation of the light diode.
3. The amplifier circuit supplies a sufficiently large output power. To be able to modulate the present light diode, the amplitude of the output current must be several hundred mA.
4. The input impedance of the amplifier circuit is large, so that it can be actuated directly by digital circuits of conventional design.
5. The amplifier circuit is small in size. If the amplifier circuit and the LED are properly separated from one another, the modulation signal must be transmitted using a cable. However, since a cable has an impedance that is significantly larger than the input impedance of the LED, this would result in a misalignment between the LED and the amplifier circuit, which means that the frequency response of the system is no longer level. Therefore it is desirable for the amplifier circuit and the LED properly to form a unit. If the installation location of the light source is taken into account, for example above the ceiling covering, this means that the system must be small.

The attributes of such amplifier circuit unite bandwidth, linearity, output power and size.

According to one embodiment the voltage control circuit can set an electrical voltage between the two base terminals of the transistors as a function of temperatures of the transistors such that the collector currents of the first and second transistor are kept constant. Thus the voltage control circuit keeps the collector currents that depend on the temperatures of the transistors constant. The temperatures can for example be recorded using a temperature-dependent resistor or a diode.

According to another embodiment the DC power supply can have a coupling capacitor electrically connected to the emitters of the two transistors using a first electrical terminal, it being possible for the second electrical terminal of said coupling capacitor to be electrically connected to ground via an electric coil and a third current source, it being possible for the light diode to be electrically connected in the conducting direction electrically parallel to the coil and to the third current source providing a closed-circuit current for the light diode.

According to a further embodiment the entry stage can be an amplifier amplifying the voltage of an input signal, especially an operational amplifier, which can be used for impedance adjustment and the output of which can be electrically connected to the voltage control circuit.

According to a further embodiment the entry stage can be an amplifier created as an integrated circuit, said amplifier having a larger bandwidth than the driver circuit.

According to a further embodiment a first voltage source can be electrically connected between the collector of the first transistor and ground, and a second voltage source can be electrically connected between the collector of the second transistor and ground, in each case to provide a supply voltage.

According to a further embodiment the first transistor can be an npn transistor and a positive pole of the first current source can be electrically connected to the base of the first transistor.

According to a further embodiment the second transistor can be a pnp transistor and a negative pole of the second current source can be electrically connected to the base of the second transistor.

According to a further embodiment a negative pole of the third current source can be electrically connected to ground.

According to a further embodiment a negative pole of the first voltage source can be electrically connected to ground and a positive pole of the first voltage source can be electrically connected to the collector of the first transistor.

According to a further embodiment a positive pole of the second voltage source can be electrically connected to ground and a negative pole of the second voltage source can be electrically connected to the collector of the second transistor.

According to a further embodiment both the transistors can be complementary field effect transistors, whereby sources can be the emitters, gates the bases and drains the collectors.

FIG. 1 shows an example amplifier circuit, according to one embodiment. An entry stage is an amplifier 1 with a high-resistance input which amplifies the voltage of the input signal. This amplifier 1 is able to actuate a subsequent driver circuit 2. The driver circuit 2 is located between the entry stage and the light diode with DC power supply. The driver circuit 2 has a relatively large input resistance, so that an integrated amplifier 1 can likewise be used as the entry stage, which necessarily has a somewhat larger bandwidth than the driver circuit 2. The driver circuit 2 includes two complementary transistors 3, two current sources 4 and a voltage control circuit 5 which sets the voltage between the two base terminals of the transistors 3 as a function of the transistor temperature. The DC power supply 6 for the light diode includes a coupling capacitor Cds and a coil Ls. The light diode LED is located immediately behind the DC power supply, so that the overall inductance between the driver circuit 2 and the LED is as small as possible. If this inductance was large, a voltage drop would arise across it which increases with the frequency, which would mean a reduction in the upper threshold frequency. By means of the DC current supply 6 a direct current is added through the coil Ls to an alternating current from the amplifier output of the driver circuit 2.

The amplifier circuit disclosed herein can likewise be realized by means of complementary field effect transistors.

What is claimed is:

1. An amplifier circuit for actuating a light diode, the amplifier circuit, comprising:

an entry stage for actuating a driver circuit, which actuates the light diode via a DC current supply, wherein the driver circuit comprises a first transistor and a second transistor that are complementary to one another, wherein emitters of the first and second transistors are electrically connected to one another, a first current source electrically connected between a first base and a first collector of the first transistor, a second current source electrically connected between a second base and a second collector of the second transistor, and a voltage control circuit electrically connected between the first and second bases of the first and second transistors, wherein the DC current supply comprises a coupling capacitor electrically connected to the emitters of both the transistors with a first electrical terminal, and wherein a second electrical terminal of said coupling capacitor is electrically connected to ground via an electric coil and a third current source, the light diode being electrically connected in a conductance direction electrically parallel to the coil and to the third current source, thereby providing a closed-circuit current for the light diode.

2. The amplifier circuit of claim 1, wherein the voltage control circuit sets an electrical voltage between the first and second bases of the first and second transistors as a function of temperatures of the first and second transistors, such that currents at the first and second collectors are kept constant.

3. The amplifier circuit of claim 1, wherein the entry stage comprises an amplifier amplifying the voltage of an input signal, which is used to adjust the impedance, and wherein the output of the amplifier is electrically connected to the voltage control circuit.

4. The amplifier circuit as claimed in claim 3, wherein the entry stage is an amplifier created as an integrated circuit, said amplifier having a larger bandwidth than the driver circuit.

5. The amplifier circuit of claim 1, wherein a first voltage source is electrically connected between the collector of the first transistor and ground, and a second voltage source is electrically connected between the collector of the second transistor and ground, in each case to provide a supply voltage.

6. The amplifier circuit of claim 1, wherein the first transistor is an npn transistor and a positive pole of the first current source is electrically connected to the base of the first transistor.

7. The amplifier circuit of claim 1, wherein the second transistor is a pop transistor and a negative pole of the second current source is electrically connected to the base of the second transistor.

8. The amplifier circuit of claim 1, wherein a negative pole of the third current source is electrically connected to ground.

9. The amplifier circuit of claim 5, wherein a negative pole of the first voltage source is electrically connected to ground, and a positive pole of the first voltage source is electrically connected to the collector of the first transistor.

10. The amplifier circuit of claim 5, wherein a positive pole of the second voltage source is electrically connected to ground, and a negative pole of the second voltage source is electrically connected to the collector of the second transistor.

11. The amplifier circuit of claim 2, wherein both the first and second transistors are complementary field effect transistors in which the sources are the emitters, the gates are the bases, and the drains are the collectors.

12. The amplifier circuit of claim 6, wherein the second transistor is a pap transistor and a negative pole of the second current source is electrically connected to the base of the second transistor.

13. The amplifier circuit of claim 9, wherein a positive pole of the second voltage source is electrically connected to ground, and a negative pole of the second voltage source is electrically connected to the collector of the second transistor.

* * * * *